United States Patent [19]
Han et al.

[11] Patent Number: 5,700,699
[45] Date of Patent: Dec. 23, 1997

[54] METHOD FOR FABRICATING A POLYCRYSTAL SILICON THIN FILM TRANSISTOR

[75] Inventors: Chul-Hi Han, Daejeon-si; Choong-Ki Kim, Seoul; Jung-Yeal Lee, Daejeon-si; Kil-Hwan Oh, Kyungki-do, all of Rep. of Korea

[73] Assignee: LG Electronics Inc., Seoul, Rep. of Korea

[21] Appl. No.: 405,501

[22] Filed: Mar. 16, 1995

[51] Int. Cl.[6] .................... H01L 21/84
[52] U.S. Cl. .................... 437/21; 437/41; 437/239; 437/978
[58] Field of Search .................... 437/21, 41 TFT, 437/238, 239, 978, 42

[56] References Cited

U.S. PATENT DOCUMENTS

| | | |
|---|---|---|
| 4,987,102 | 1/1991 | Nguyen et al. ............. 437/238 |
| 5,235,189 | 8/1993 | Hayden et al. . |
| 5,300,455 | 4/1994 | Vuillermoz et al. . |
| 5,424,225 | 6/1995 | Yamaguchi et al. ............. 437/21 |

OTHER PUBLICATIONS

Lee et al., "High Performance Low Temperature Polysilicon Thin Film Transistor Using ECR Plasma Thermal Oxide as Gate Insulator", IEEE Electron Device Letters, vol. 15, No. 8, Aug. 1994, pp. 301–303.
Lee et al., "ECR Plasma Oxidation Effects on Performance and Stability of Polysilicon Thin Film Transistors", IEDM, pp. 20.3.1–20.3.4, 1994 month unknown.
Little et al., Japanese Journal of Applied Physics, 30(12B), pp. 3724–3728 (1991), month unknown.

*Primary Examiner*—John Niebling
*Assistant Examiner*—Richard A. Booth
*Attorney, Agent, or Firm*—John P. White

[57] ABSTRACT

A method for fabricating the polycrystal silicon TFT under a low temperature which has an improved electron mobility, comprises the steps of forming an oxide film on a substrate, depositing a polycrystal silicon on the oxide film and patterning the polycrystal silicon so that source and drain regions and a channel region remain, growing a gate insulating layer on the patterned polycrystal silicon by ECR plasma thermal oxidation, depositing a material for a gate on the whole surface and removing the material and the gate insulating layer in portions except for a gate region to form the gate, and performing ion implantation on the exposed areas of the polycrystal silicon to form the source and drain regions.

10 Claims, 5 Drawing Sheets

5,700,699

METHOD FOR FABRICATING A POLYCRYSTAL SILICON THIN FILM TRANSISTOR

FIELD OF THE INVENTION

This invention relates to a method for fabricating a polycrystal silicon thin film transistor (TFT) used in a liquid crystal display (LCD) device, and more particularly to the method for fabricating the polycrystal silicon TFT under a low temperature which has an improved electron mobility.

BACKGROUND OF THE INVENTION

FIG. 1 is a sectional view of a conventional polycrystal silicon TFT, in which a polycrystal silicon 3 is formed in an active region, source and drain regions 4 and 5 are self-aligned with a gate 7. This structure has an advantage that a driving circuit can be mounted in a printed circuit board with the pixels when the polycrystal silicon TFTs are employed as the driving circuit of an LCD device, because electron mobility of the polycrystal silicon 3 is high. In FIG. 1, 1 is a substrate, 2 is an insulating layer, 6 is a gate insulating layer, 8 is an insulating interlayer and 9 are aluminum electrodes for the source and drain regions 4 and 5.

Referring to FIG. 2a to 2d, a conventional method for fabricating the polycrystal silicon TFT of FIG. 1 will be explained.

As shown in FIG. 2a, the insulating layer 2 is formed on the substrate 1 and the polycrystal silicon 3 is deposited thereon. The polycrystal silicon 3 on the insulating layer 2 is removed in areas except where source, drain and channel regions are to be formed. The gate insulating layer 6 is then deposited on the whole surface, as shown in FIG. 2b. The gate insulating layer 6 may be a thermal oxide film having a thickness of approximately 1,000 angstroms which is obtained by thermal oxidizing the polycrystal silicon 3, or an oxide film deposited by a conventional chemical vapor deposition (CVD) method. Also, the gate insulating layer 6 may be a multilayer having the thermal oxide film and the oxide film deposited by CVD method.

After the polycrystal silicon 7 having a thickness of approximately 2,000 and 4,000 angstroms is deposited on the surface by the CVD method, the polycrystal silicon layer 7 and the gate insulating layer 6 are patterned and etched to provide the gate 7 and the gate insulating layer 6 as shown in FIG. 2c. After this, anion implantation is performed on the exposed areas of the polycrystal silicon 3.

As shown in FIG. 2d, an oxide film for the interlayer 8 having a thickness of 2,000 to 4,000 angstroms is deposited on the whole surface by the CVD method. The ion implanted regions are activated by thermal energy according to the deposition of the interlayer 8 to form the source and drain regions 4 and 5. After contact openings for the source and drain regions 4 and 5 are formed on the interlayer 8, aluminum is deposited and formed by photolithography, sequentially, into the source and drain electrodes 9.

However, in the conventional method, the interface between the gate insulating layer 6 and the polycrystal silicon 3 is not flattened because of the difference between the diffusion coefficients of the oxygen atom and molecule when the gate insulating layer 6 is obtained by thermal oxidizing of the polycrystal silicon 3. That is, the diffusion coefficient on the grain boundary of the polysilicon 3 is faster than that on the rest of its area. And, an expensive substrate for processing under a high temperature is required when the gate insulating layer 6 is obtained by thermal oxidizing the polycrystal silicon 3. Moreover, when the gate insulating layer 6 is formed by the CVD method, the surface of the polycrystal silicon becomes the interface between the gate insulating layer and the channel so that the trap state of the interface is high which lowers the electron mobility.

SUMMARY OF THE INVENTION

An object of this invention is to provide a method for fabricating a polycrystal silicon TFT which improves electron mobility to increase driving ability.

This and other objects are achieved by providing a method for fabricating a polycrystal silicon thin film transistor comprising the steps of forming an oxide film on a substrate, depositing a polycrystal silicon on the oxide film and patterning the polycrystal silicon so that a source region, a drain region and a channel region remain, growing a gate insulating layer on the patterned polycrystal silicon by using an oxygen plasma, depositing a material for a gate on the whole surface and removing the material and the gate insulating layer in portions except for a gate region to form the gate, and performing an ion implantation on exposed areas of the polycrystal silicon to form the source and drain regions.

DETAILED DESCRIPTION OF THE INVENTION

FIGS. 3a to 3d are sectional views of the process steps in accordance with this invention.

Figure 1:
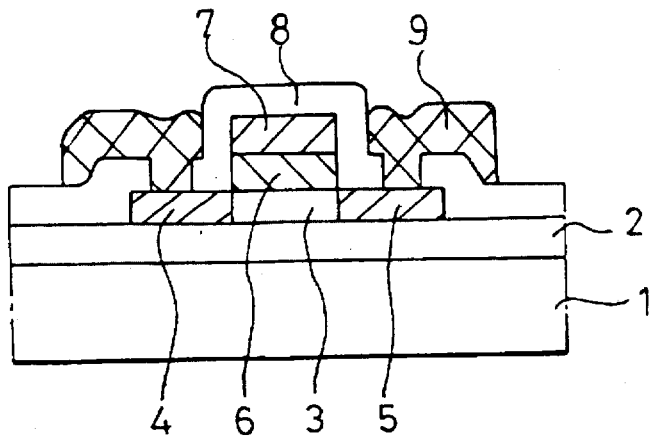
FIG. 1 is a sectional view of a conventional polycrystal silicon TFT.
Figure 2A:
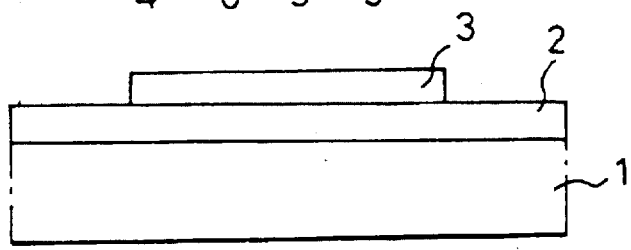
FIGS. 2a to 2d are sectional views of the process steps of a conventional method.
Figure 2B:
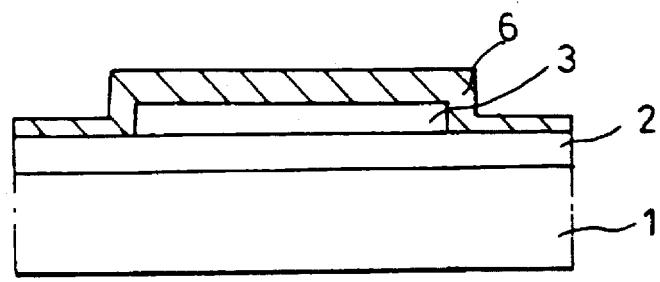
Figure 2C:
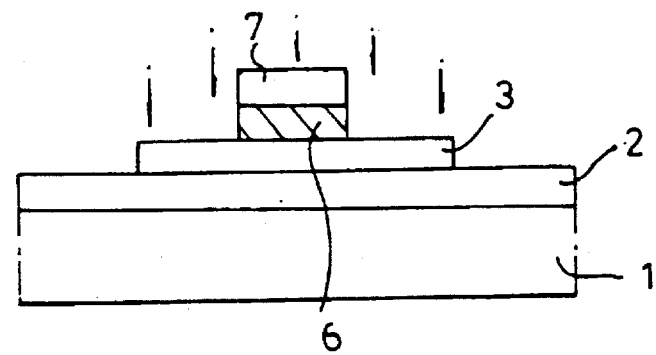
Figure 2D:
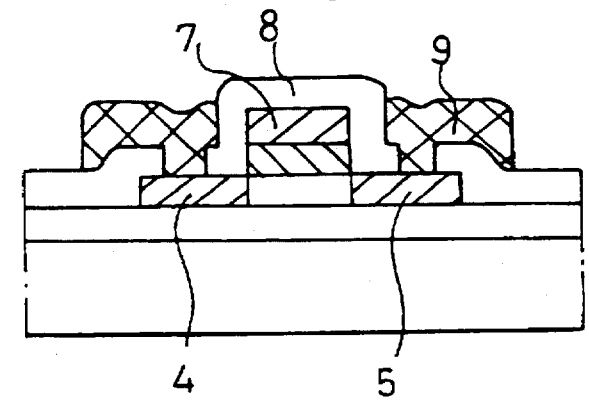
Figure 3A:
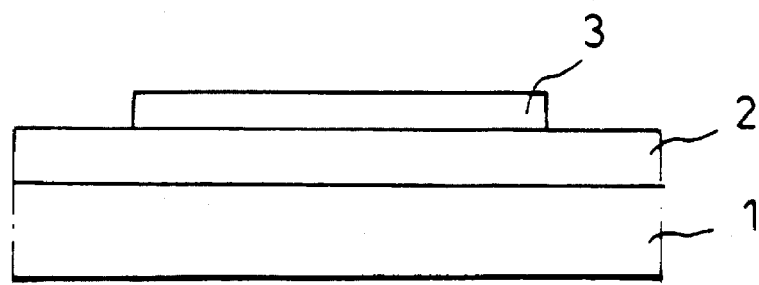
FIGS. 3a to 3d are sectional views of the process steps in accordance with a first embodiment of this invention.

In FIG. 3a, there is a substrate 1 on which an oxide layer 2 is formed. A polycrystal silicon 3 is deposited on the whole surface and patterned by defining a source region, a drain region and a channel region.

Figure 3B:
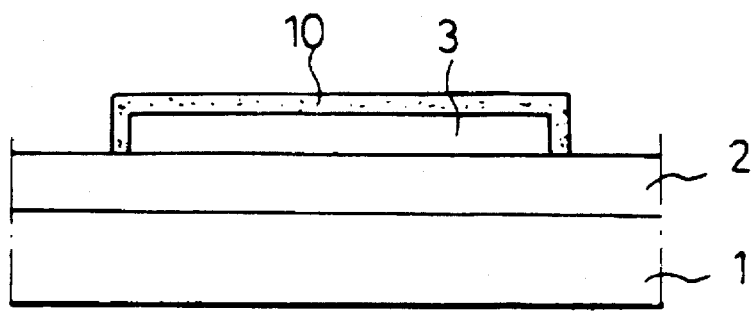

A thin oxide film 10 having a thickness of approximately 150 to 450 angstroms is grown by ECR oxygen plasma on the polycrystal silicon 3, as shown in FIG. 3b. A pressure within the reaction chamber is set from 0.5 to 2 mTorr, preferably 1.2 mTorr, a substrate temperature is set from 100 to 400 degrees centigrade and flow rates for oxygen and argon at 6 sccm and at 8 sccm respectively.

Figure 3C:
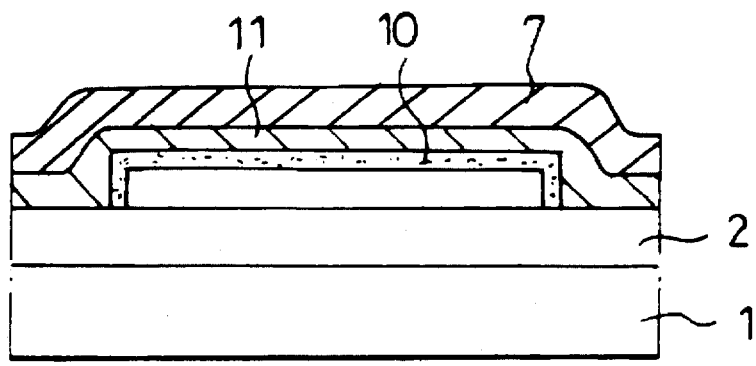

On the whole surface, an oxide film 11 and a polycrystal silicon (or amorphous silicon) 7 are deposited by the CVD method, as shown in FIG. 3c. The oxide films 10 and 11 have a total thickness of 800 to 1500 angstroms and the polycrystal silicon 7 has a thickness of 2,000 to 4,000 angstroms.

Figure 3D:
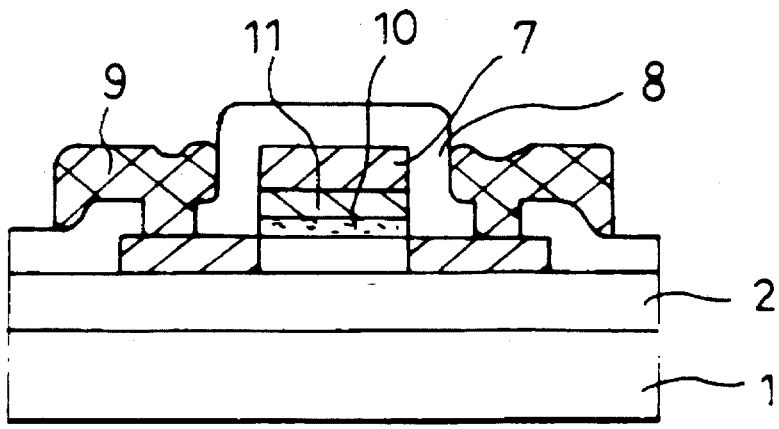

Then, as shown in FIG. 3d, after removing the polycrystal silicon 7 and the oxide films 10 and 11 by photolithography using a gate mask to etch away the rest of a gate region, ion implantation is performed on exposed areas of the polycrystal silicon 3 so as to form source and drain regions 4 and 5. And an oxide film for an interlayer 8 having a thickness of 3,000 to 4,000 angstroms is deposited on the whole surface by the CVD method, contact openings for the source and drain regions 4 and 5 are formed on the interlayer 8 and aluminum is deposited thereon and source and drain electrodes 9 are formed by lithography, sequentially.

Figure 4:
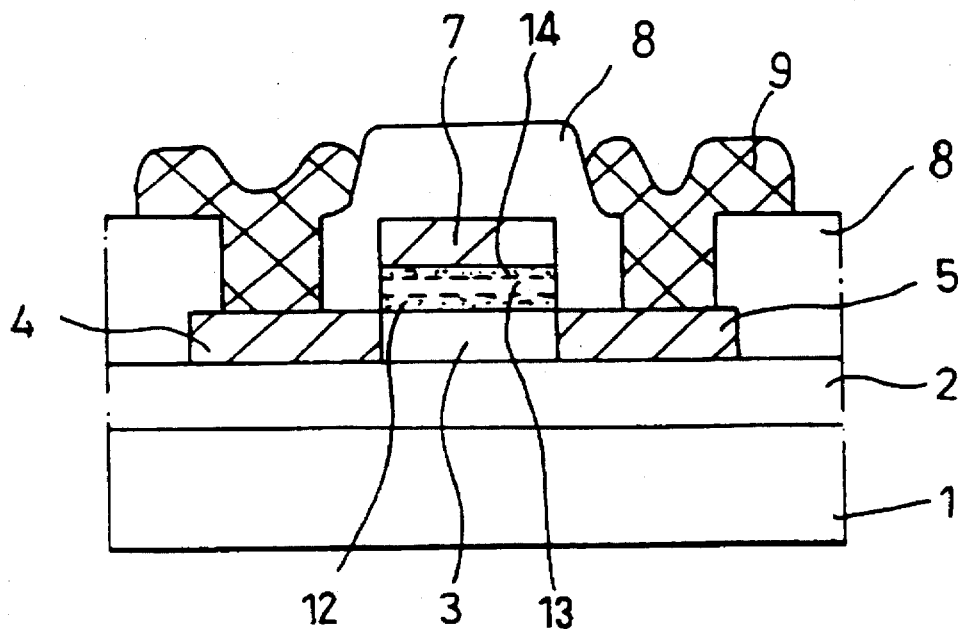
FIG. 4 is a sectional view in accordance with a second embodiment of this invention.

On the other hand, as a second embodiment of this invention, the gate insulating layer can be ONO (oxide/nitride/oxide) films made by utilizing the ECR oxygen plasma, as shown in FIG. 4. After using the same process as for the aforementioned first embodiment of this invention in forming up to polycrystal silicon 3, a thin oxide film 12 is formed on the polycrystal silicon 3 by the ECR oxygen plasma. Thereafter, replacing only the reaction gas, oxygen, and the carrier gas, argon, with silicon compound gas and nitrogen or nitrogen compound gas (for example with $N_2$ or $NH_4$ gas), a nitride film 13 is deposited or grown thereon, and replacing the $N_2$ or $NH_4$ gas with $O_2$ again, an oxide film 14 is formed thereon by the ECR oxygen plasma. In this case, after forming the ONO films 12, 13 and 14, it can be annealed at 500 to 600 degrees centigrade to activate the ions and atoms of oxygen and nitrogen and, thus, increase the density of the ONO insulating layer.

Figure 5:
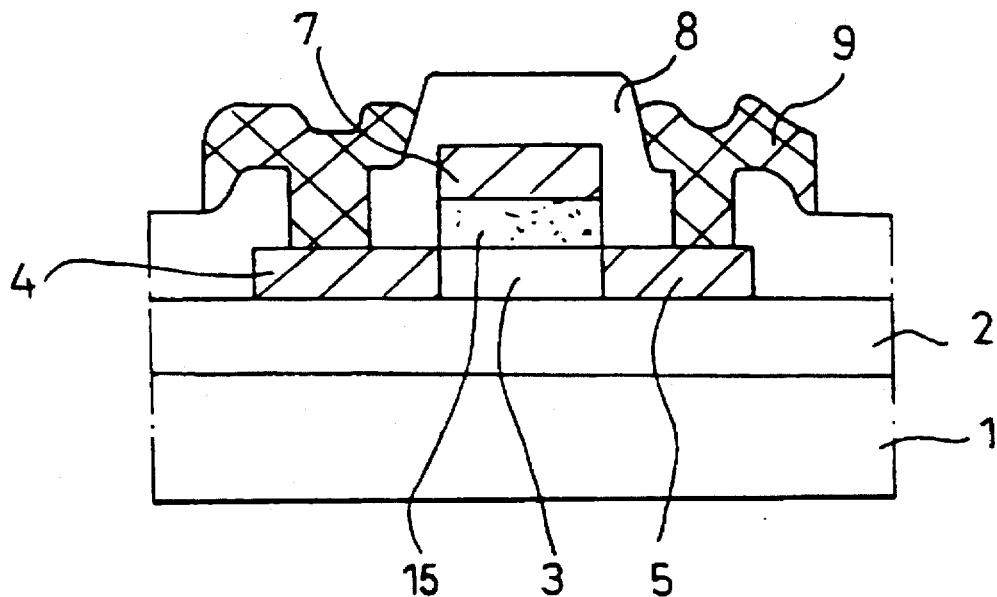
FIG. 5 is a sectional view in accordance with a third embodiment of this invention.

Further, as a third embodiment of this invention, without forming either the double gate insulating layer formed by the ECR oxide film 10 and the CVD oxide film 11, or the ONO films formed by the ECR oxide film 12, the nitride film 13 and the ECR oxide film 14, a single oxide film 15 can be grown to a thickness of about 400 to 600 angstroms by the ECR oxygen plasma, as shown in FIG. 5. Under the same condition as growing the ECR oxide film in the first and second embodiment of this invention, an oxide film 15 having a thickness of approximately the polycrystal silicon layer 3 is formed and annealed at 500 to 600 degrees centigrade, so that the gate insulating layer can be obtained.

The characteristics of the polycrystal silicon TFT produced in accordance with this invention as described above, are as follows.

Figure 6:
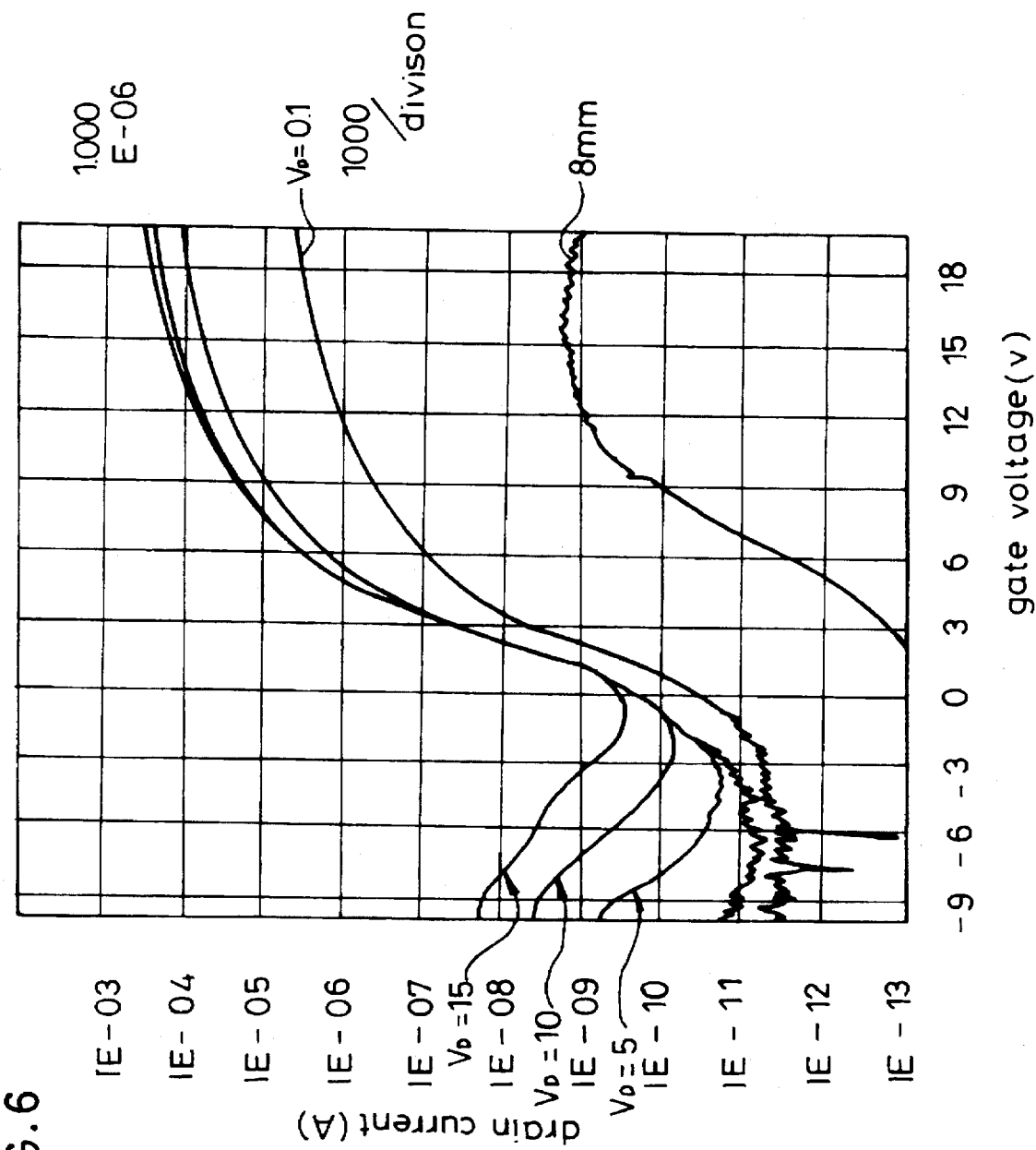
FIG. 6 is a graph showing one characteristic of the polycrystal silicon TFT of this invention.

FIG. 6 shows the characteristic of ID (drain current)—VG (voltage applied to the gate) of the polycrystal silicon TFT in which the maximum process temperatures in producing the TFT are 950 degrees centigrade, the oxide film grown by the ECR plasma thermal oxidation has a thickness of 330 angstroms as the gate insulating layer, the gate insulating layer including the ECR oxide film has a total thickness of 850 angstroms, and the ratio of the width W to the length L of the gate (W/L) is 20/20 µm. It is found that the electron mobility in the channel region is 115 $cm^2/V \cdot sec$ from equation $gm=(W/L)\mu CoxVDS$ (where, $\mu$ is the electron mobility, Cox is a capacitance per unit area of the gate insulating layer, and VD is a drain voltage).

Figure 7:
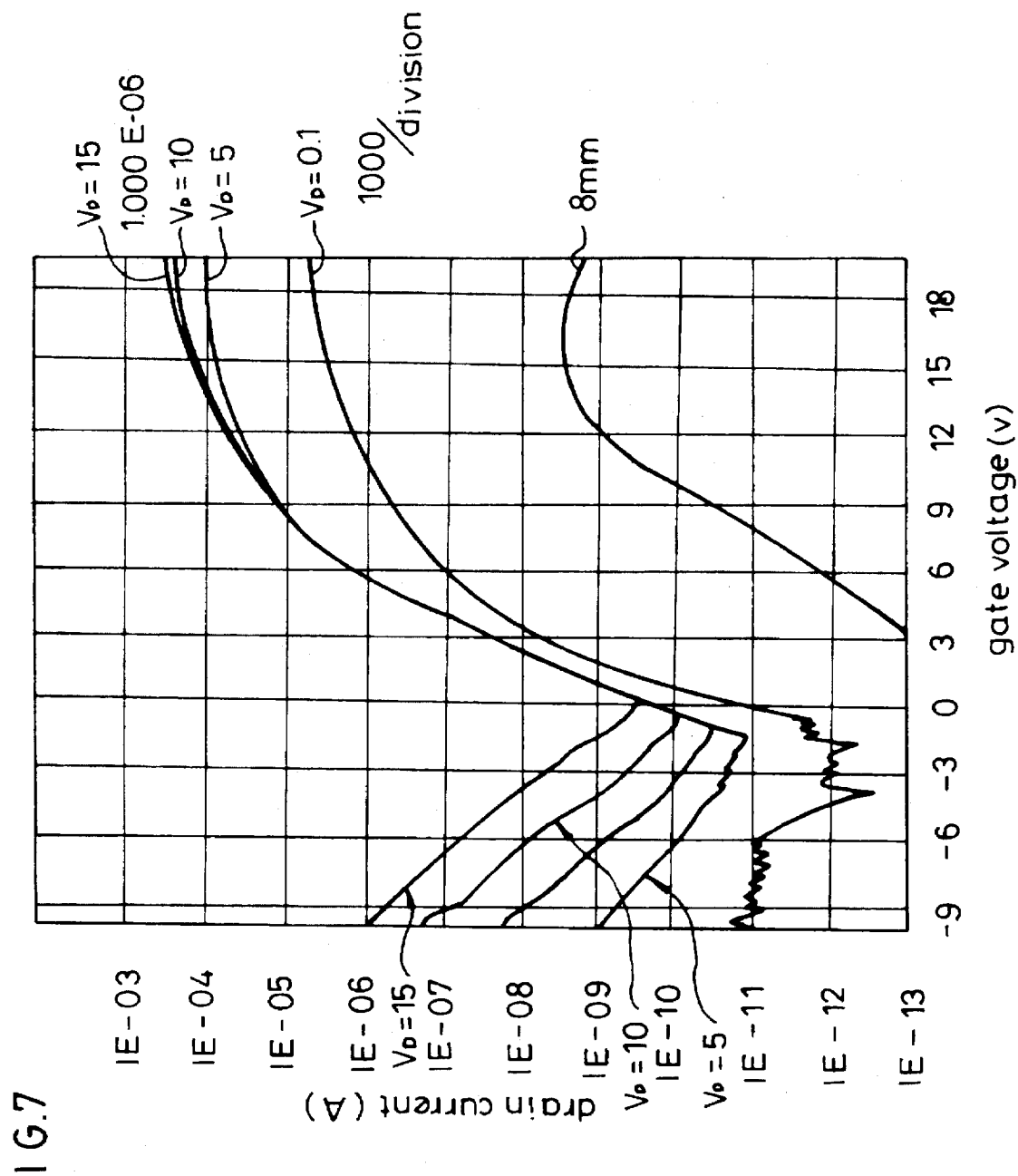
FIG. 7 is a graph showing another characteristic of the polycrystal silicon TFT of this invention.

Further, FIG. 7 shows the characteristic of ID-VG of the polycrystal silicon TFT in which the maximum processes temperatures are 600 degrees centigrade, the ECR oxide film grown by ECR plasma thermal oxidation has a thickness of 400 angstroms, the gate insulating layer has a total thickness of 800 angstroms and the W/L of the gate is 50/20 µm. It is found that electron mobility of 51 $cm^2/V \cdot sec$ can be obtained from the above equation on the safe side. Thus, in accordance with this invention, relatively high electron mobility can be obtained even at temperatures below 600 degrees centigrade.

The aforementioned fabricating method of the polycrystal silicon TFT in accordance with this invention has the following advantages.

In the channel region, the electron mobility can be improved by growing the gate insulating layer in the polycrystal silicon TFT using the ECR oxygen plasma, so that driving speed is increased to improve driving ability when the polycrystal silicon TFT is used as a driving circuit of an LCD. Thus, the number of blocks for the driving circuit can be decreased, so that production efficiency is improved. Also, a stabilized electron mobility can be obtained under low temperature processes, so that a low price glass substrate can be used, to reduce the cost of production.

We claim:

1. A method for fabricating a polycrystalline silicon thin film transistor comprising the steps of:

forming an oxide film on a substrate;

depositing a polycrystalline silicon film on the oxide film and patterning the polycrystalline silicon film so that a source region, a drain region and a channel region remain;

growing a gate insulating layer on the patterned polycrystalline silicon film by using an ECR plasma oxidation;

depositing a material for a gate on the whole surface and removing the material and the gate insulating layer in portions to leave exposed portions of the polycrystalline silicon film except for a gate region to form the gate; and performing an ion implantation on exposed areas of the polycrystalline silicon film to form the source and drain regions.

2. A method as claimed in claim 1, further comprising the steps of, after forming the source and drain regions, depositing an interlayer on the whole surface and forming contact openings for the source and drain regions on the interlayer and depositing an electric conductor on the whole surface and patterning the electric conductor to form source and drain electrodes.

3. A method for fabricating a polycrystalline silicon thin film transistor comprising the steps of:

forming an oxide film on a substrate;

depositing a polycrystalline silicon film on the oxide film and patterning the polycrystalline silicon film so that a source region, a drain region and a channel region remain;

forming a gate insulating layer having a first oxide film and a second oxide film on the patterned polycrystalline silicon film the first oxide film grown by an ECR plasma thermal oxidation, the second oxide film deposited by using a chemical vapor deposition;

depositing a material for a gate on the whole surface and removing the material and the gate insulating layer in portions to leave exposed portions of the polycrystalline silicon film except for a gate region to form the gate; and performing an ion implantation on exposed areas of the polycrystalline silicon film to form the source and drain regions.

4. A method as claimed in claim 3, wherein the first oxide film has a thickness of 150 to 450 angstroms.

5. A method as claimed in claim 3, wherein the gate insulating layer has a thickness of 800 to 1,500 angstroms.

6. A method for fabricating a polycrystalline silicon thin film transistor comprising the steps of:

forming an oxide film on a substrate;

depositing a polycrystalline silicon film on the oxide film and patterning the polycrystalline silicon film so that a source region, a drain region and a channel region remain;

forming a gate insulating layer having a first oxide film, a nitride film and a second oxide film on the patterned polycrystalline silicon film the first oxide film grown by an ECR plasma thermal oxidation, the nitride film deposited or grown by using a nitrogen plasma, the second oxide film grown by the ECR plasma thermal oxidation and the gate insulating layer is formed under a temperature of less than or equal to 400 degrees centigrade;

depositing a material for a gate on the whole surface and removing the material and the gate insulating layer in portions to leave exposed portions of the polycrystalline silicon film except for a gate region to form the gate; and performing an ion implantation on exposed areas of the polycrystalline silicon film to form the source and drain regions.

7. A method as claimed in claim 6, wherein each step of forming the gate insulating layer is carried out under the same conditions except a reaction gas is changed.

8. A method as claimed in claim 6, further comprising the step of annealing under temperatures of 500 to 600 degrees centigrade after the second oxide of the gate insulating layer is grown.

9. A method for fabricating a polycrystalline silicon thin film transistor comprising the steps of:

forming an oxide film on a substrate;

depositing a polycrystalline silicon film on the oxide film and patterning the polycrystalline silicon film so that a source region, a drain region and a channel region remain;

forming a gate insulating layer on the patterned polycrystalline silicon film the gate insulating layer being an oxide film grown by an ECR plasma thermal oxidation;

depositing a material for a gate on the whole surface and removing the material and the gate insulating layer in portions to leave exposed portions of the polycrystalline silicon film except for a gate region to form the gate; and performing an ion implantation on exposed areas of the polycrystalline silicon film to form the source and drain regions.

10. A method as claimed in claim 9, further comprising the step of annealing under temperatures of 500 to 600 degrees centigrade after the forming of the gate insulating layer.

* * * * *